United States Patent
Chen et al.

(10) Patent No.: US 8,107,294 B2
(45) Date of Patent: *Jan. 31, 2012

(54) READ MODE FOR FLASH MEMORY

(75) Inventors: Hounien Chen, Fremont, CA (US); Nancy S. Leong, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/730,452

(22) Filed: Mar. 24, 2010

(65) Prior Publication Data

US 2010/0177568 A1    Jul. 15, 2010

Related U.S. Application Data

(62) Division of application No. 11/189,923, filed on Jul. 27, 2005, now Pat. No. 7,706,183.

(51) Int. Cl.
  *G11C 16/04*  (2006.01)
  *G11C 16/06*  (2006.01)
  *G11C 16/26*  (2006.01)
  *G11C 16/08*  (2006.01)

(52) U.S. Cl. ........... 365/185.12; 365/238.5; 365/189.15; 365/239; 711/103

(58) Field of Classification Search ............. 365/185.12, 365/185.29, 185.03, 238.5, 235, 239, 185.33, 365/189.15; 711/103, 156

See application file for complete search history.

(56) References Cited

U.S. PATENT DOCUMENTS

| | | | |
|---|---|---|---|
| 5,280,594 A | 1/1994 | Young et al. | |
| 5,473,570 A | 12/1995 | Sato et al. | |
| 6,154,808 A | 11/2000 | Nagase et al. | |
| 6,178,479 B1 | 1/2001 | Vishin | |
| 6,282,624 B1 | 8/2001 | Kimura et al. | |
| 6,304,510 B1 | 10/2001 | Nobunaga et al. | |
| 6,377,500 B1 | 4/2002 | Fujimoto et al. | |
| 6,377,507 B1 | 4/2002 | Tsao | |
| 6,388,908 B1 | 5/2002 | Araki et al. | |

(Continued)

FOREIGN PATENT DOCUMENTS

EP    1 223 586 A1    7/2002

(Continued)

OTHER PUBLICATIONS

Co-pending U.S. Appl. No. 11/189,923, filed Jul. 27, 2005, Hounien Chen et al., entitled "Read Mode for Flash Memory".

(Continued)

*Primary Examiner* — J. H. Hur

(74) *Attorney, Agent, or Firm* — Harrity & Harrity, LLP (57) ABSTRACT

A method for reading a nonvolatile memory array including an array of memory cells, each memory cell including a substrate, a control gate, a charge storage element, a source region and a drain region, includes receiving, at an address register, a read command including an address for a memory cell in the array of memory cells and an indication regarding whether the read command is a full page read command or a partial page read command. A starting address for a page including the received address is identified, wherein the page includes multiple rows of memory cells in the array of memory cells. The address register is reset to the starting address for the page. It is determined whether all memory cells in the page are non-programmed. Data indicative of a non-programmed state of the page is output if it is determined that all memory cells in the page are non-programmed.

19 Claims, 5 Drawing Sheets

U.S. PATENT DOCUMENTS

| | | |
|---|---|---|
| 6,412,080 B1 | 6/2002 | Fleming et al. |
| 6,622,201 B1 | 9/2003 | VanBuskirk et al. |
| 7,423,915 B2 | 9/2008 | Leong et al. |
| 7,706,183 B2 * | 4/2010 | Chen et al. ............... 365/185.12 |
| 2002/0041527 A1 | 4/2002 | Tanaka et al. |
| 2002/0130334 A1 | 9/2002 | Gastaldi et al. |
| 2003/0067808 A1 | 4/2003 | Tuan et al. |
| 2003/0076719 A1 | 4/2003 | Byeon et al. |
| 2003/0117861 A1 | 6/2003 | Maayan et al. |
| 2004/0062080 A1 | 4/2004 | Kato |
| 2004/0133755 A1 | 7/2004 | Chambers |
| 2005/0226046 A1 | 10/2005 | Lee et al. |

FOREIGN PATENT DOCUMENTS

| | | |
|---|---|---|
| EP | 1 513 160 A1 | 3/2005 |
| WO | WO 00/30116 A1 | 5/2000 |

OTHER PUBLICATIONS

2002 IEEE International Solid-State Circuits Conference, Session 6, "SRAM and Non-Volatile Memories," Feb. 4, 2004, 6 pages.

2002 IEEE International Solid-State Circuits Conference, 23 pages.

International Search Report and Written Opinion dated Jan. 2, 2007.

* cited by examiner

READ MODE FOR FLASH MEMORY

RELATED APPLICATION

This application is a divisional of U.S. patent application Ser. No. 11/189,923, filed Jul. 27, 2005, which is incorporated herein by reference.

TECHNICAL FIELD

The present invention relates generally to non-volatile memory devices, and more specifically, to data reading operations for non-volatile memory devices.

BACKGROUND ART

Flash memory is a common type of non-volatile semiconductor memory device. Non-volatile refers to the trait of retaining stored data when power is turned off. Because flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In a conventional flash memory architecture, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

Flash memory typically includes two distinct types: NOR flash memory, and NAND flash memory. Generally speaking, conventional NOR flash memory is considered to be a code-level memory, while NAND flash memory is considered to be a data-level memory. More specifically, NOR flash memory is typically configured to provide a very reliable storage environment and to further enable fast and random reading of each memory cell in the device. This is accomplished by providing individual contacts to each cell in the device. The reliability and random access nature of the NOR architecture make NOR flash memory particularly suitable for code storage, such as mobile phone and set top box operating systems, etc. Unfortunately, the individually addressable nature of conventional NOR flash memory cells tends to limit the speed at which cells may be programmed and erased as well as limit rapid reductions in device sizes. Typical NOR flash memory devices have program rates on the order of 0.4 megabytes per second (MB/s) and erase rates on the order of 0.3 MB/s.

NAND flash memory, on the other hand, is configured to enable serial or page-based access to data stored therein. This is accomplished by linking memory cells to each other and only providing access to the cells as a group or page. This architecture has the advantage of enabling decreased device sizes and also for providing fast write times. However, because each cell is not individually addressable, NAND devices are generally considered less reliable and therefore more suitable for data storage than code storage. Typical NAND flash memory devices have program rates on the order of 8 MB/second and erase rates on the order of 60 MB/second.

DISCLOSURE OF THE INVENTION

One aspect of the invention is directed to a method for reading a nonvolatile memory array including an array of memory cells, each memory cell including a substrate, a control gate, a charge storage element, a source region and a drain region. The method includes receiving, at an address register, a read command including an address for a memory cell in the array of memory cells and an indication regarding whether the read command is a full page read command or a partial page read command. A starting address for a page including the received address is identified, wherein the page includes multiple rows of memory cells in the array of memory cells. The address register may be set to the starting address for the page. It may then be determined whether all memory cells in the page are in a non-programmed state. Data indicative of the non-programmed state of the page may be output when it is determined that all memory cells in the page are in a non-programmed state.

Another aspect is directed to a memory device including an array of non-volatile memory cells having a core area and a spare area. The array may include a plurality of columns, with each column having a bit line connected to source or drain regions of a plurality of the memory cells. The array may further include a plurality of rows, arranged orthogonally to the columns, with each row having a word line connected to gate regions of a plurality of the memory cells. A plurality of sense amplifiers may be operatively connected to the plurality of bit lines for sensing a threshold voltage of memory cells connected to the bit lines. Control logic may be configured to receive a read command identifying a memory cell to be read, wherein the read command includes a row address designating a selected row and a column address designating a selected column. Control logic may be configured to determine whether each memory cell in the selected row is in a non-programmed state. Control logic may be configured to output data to an output memory indicative of the non-programmed state of the memory cells along the selected row.

Yet another aspect of the invention is directed to a method for reading a page of dual-bit memory cells configured as an array, each page including multiple rows of memory cells, and each memory cell including a substrate, a control gate, a charge storage element having two charge storage areas, a source region, and a drain region. The method may include receiving a read command including an address and a page mode designation; setting the address to a first address for the page, wherein the first address designates a starting address for the read operation on the first row of the page, the starting address designating a current row and a current column; determining whether every memory cell in the current row is in a non-programmed state; determining whether the received address designates a full page mode or a partial page mode if it is determined that every memory cell in the current row is in a non-programmed state; and outputting data from the current row to an output memory if it is determined that the received address designates partial page mode.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a flash memory reading technique in which memory cells may be read in as a page or as a partial page. Alternatively, a dynamic reference bit may be set to indicate a programmed status of the memory cells.

Memory Device Overview

Figure 1:
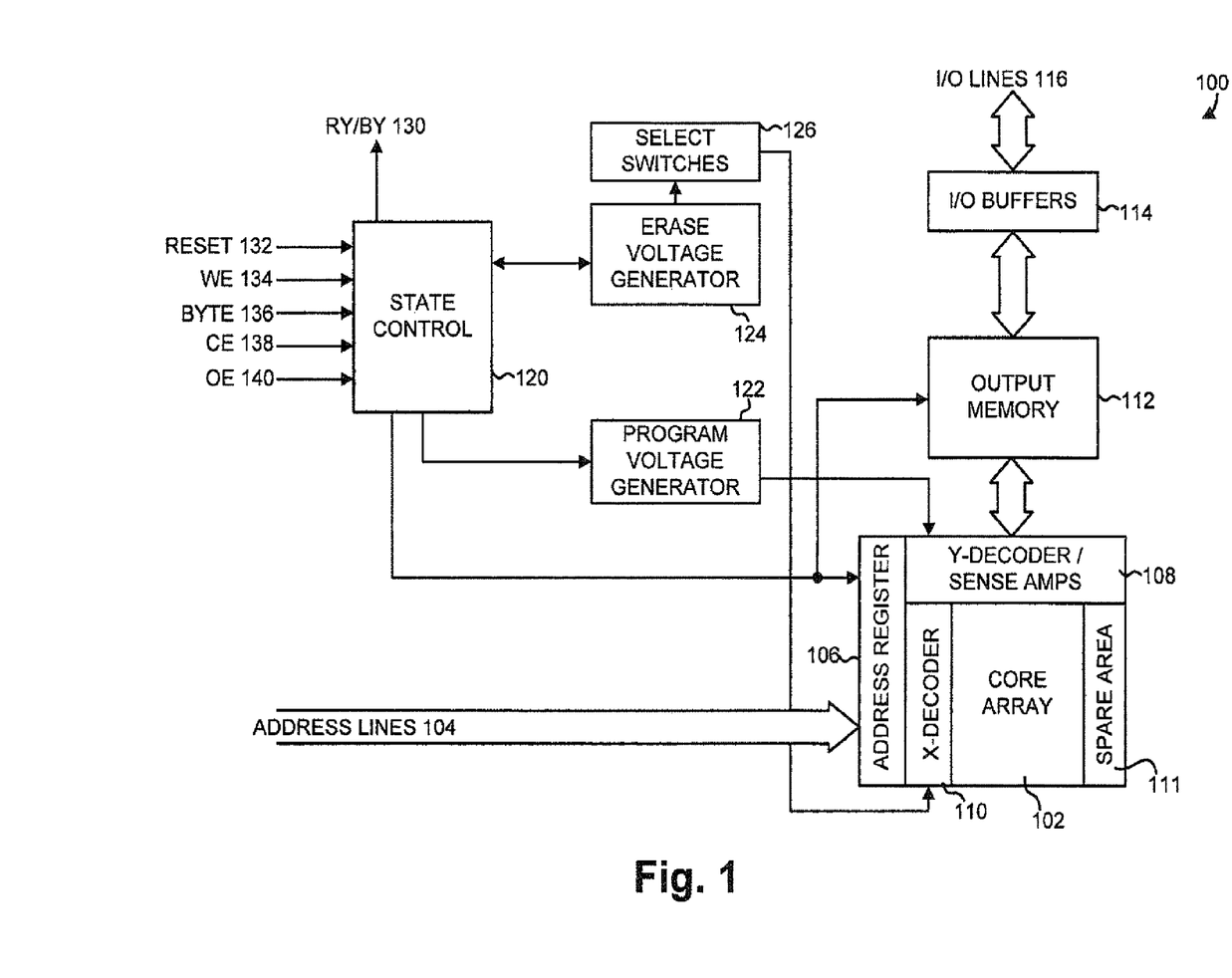
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core array 102. Core array 102 may include arrays of high density memory cells, such as, for example, SONOS-type (silicon-oxide-nitride-oxide-silicon) NOR memory cells, where the nitride layer acts as the charge storage element. More specifically, core array 102 may include multiple M×N memory arrays of substantially identical memory cells. As will be discussed in more detail below, core array 102 may be a sequential access memory in which cells data may be accessed in designated groups, such as pages or partial pages. Physically, in one implementation consistent with principles of the invention, a page of data may refer to a series of four sequential rows of memory cells in core array 102. Logically, pages can be thought of as blocks of data having predetermined sizes through which memory device 100 is accessed. In one implementation, the page size for memory device 100 is approximately two-thousand bytes (i.e., 2 k bytes).

Core array 102 may be accessed by providing an address for a page via address lines 104 to address register 106. Address register 106 may receive input address values and distribute them to Y-decoder 108 and X-decoder 110. Decoders 108 and 110 may decode the address values so that the source, gate, and drains of the memory cells referred to by the received addresses are activated and their data values read. The decoded addresses specify the appropriate physical lines in the memory cell array(s) that are to be used. For instance, a page of data may be activated and read out of core array 102 in parallel. The read data may be written to output memory 112 before being clocked to input/output (I/O) buffers 114 and read out via I/O lines 116. Y-decoder 108 may also include appropriate sense amplifier circuitry. Sense amplifiers may be used to sense the programmed or non-programmed state of the memory cells in core area 102.

In additional to core array 102, memory cells may also be formed in a peripheral region or "spare area" 111 associated with the core array 102. Data associated with core array 102 but not including substantive user data may be maintained in spare area 111. For example, spare area 111 may include a dynamic reference bit associated with each row of core array 102, the purpose of which will be described in additional detail below.

In some implementations, the memory cells in array 102 may be implemented such that each memory cell can store two or more bits. In one such multi-bit per memory cell technology, called MirrorBit™, the intrinsic density of a Flash memory array can be doubled by storing two physically distinct charges on opposite sides of a memory cell. Each charge, representing a bit within a cell serves as binary unit of data (e.g. either "1" or "0"). Reading or programming one side of a memory cell occurs independently of the data that is stored on the opposite side of the cell.

Output memory 112 may include static random access memory (SRAM) or dynamic random access memory (DRAM) type memory that can serve as a memory cache between core area 102 and I/O buffers 114. Output memory 112 may thus be a volatile memory (i.e., loses its data when powered down) and, relative to the memory cells in core array 102, may be a high speed memory.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126.

State control component 120 may implement a state machine that dictates the function of memory device 100 based on a number of control signals, illustrated as the signals: reset line 132, write enable (WE) line 134, byte line 136, chip enable (CE) line 138, and output enable (OE) line 140. Reset line 132, when activated, causes a hardware reset of memory device 100. Write enable line 134 enables writing of data to core array 102. Byte line 136 selects the width of the output data bus. For example, byte line 136 may cause I/O lines 116 to function as an eight-bit data bus or a sixteen-bit data bus, depending on the state of byte line 136. Chip enable line 138 enables the reading/writing of data to memory device 100. When chip enable line 138 is held at its designated non-active level, the output pins of memory device 100 may be placed in a high impedance (non-active) state. To activate the memory device 100, chip enable line 138 may be held in its active state. Output enable line 140 enables reading of data from core array 102 and outputting the data via I/O lines 116.

Program voltage generator 122 and erase voltage generator 124 may generate the appropriate voltages needed for reading and writing from/to core array 102. For example, in one implementation, core array 102 may require relatively high voltages to erase and program the memory cells in core array 102. These higher voltages may be provided from program voltage generator 122 and erase voltage generator 124.

Select switches 126 may include select transistors connected to core array 102. Each select switch may be used to control a series of memory cells, such as a column of memory cells.

Also shown in FIG. 1 is ready/busy (RY/BY) line 130. Ready/busy line 130 may indicate when memory device 100 is performing an embedded program or erase operation. More specifically, when in the "busy" state, ready/busy line 130 indicates that memory device 100 is currently performing a program or erase operation. When in the "ready" state, ready/busy line 130 indicates that memory device 100 is not currently performing program or erase operation.

Figure 2:
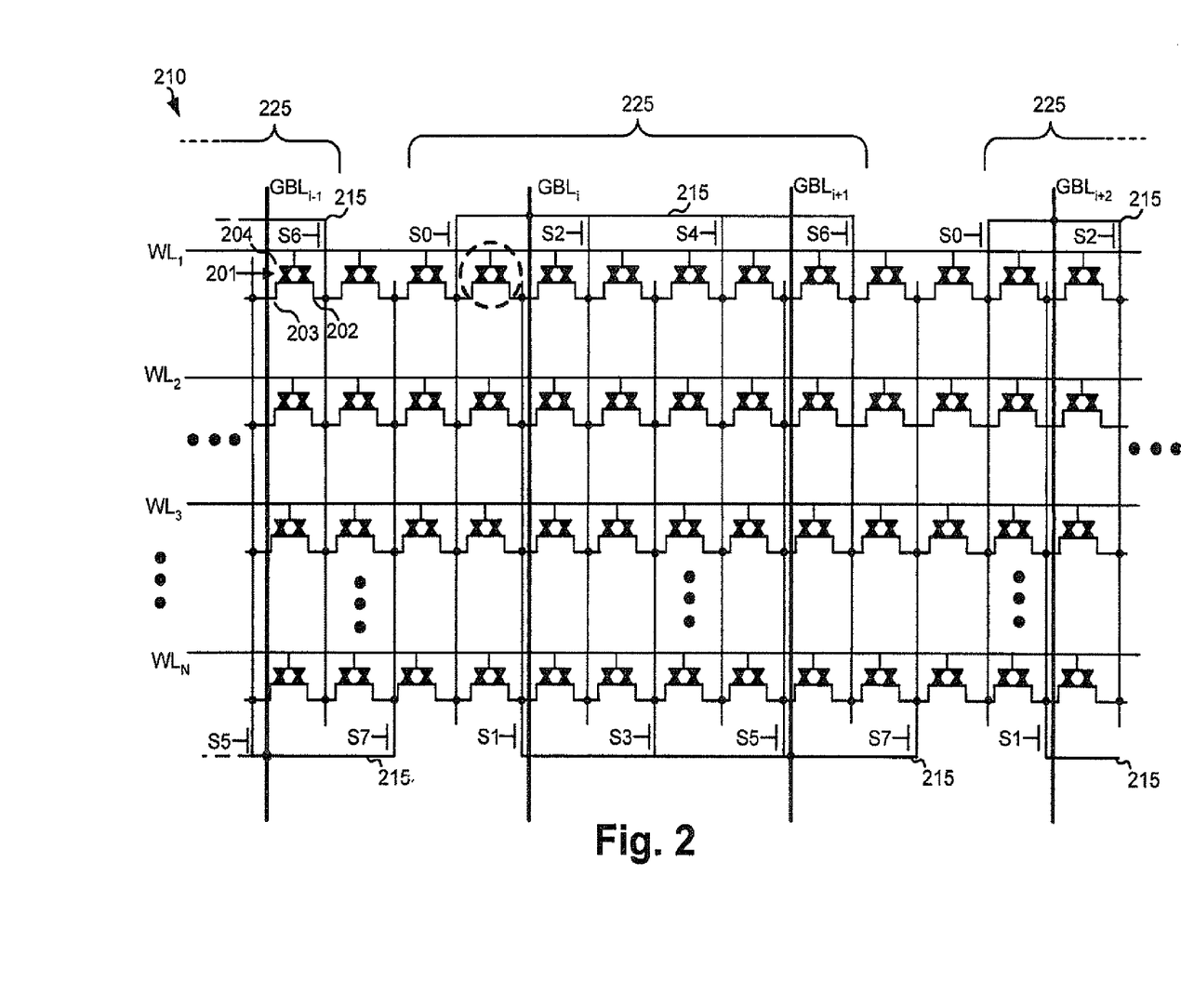
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells in a row. Bit lines may form columns in the array arranged orthogonally to the rows or word lines in array 210. The bit lines include global bit lines ($GBL_{i-1}$ through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core area 102 includes NOR-type Flash memory. Furthermore, in accordance with principles of the invention, memory cells 201 may be configured to form page-like groups of memory cells to further facilitate NAND-like interaction and performance.

Although only four bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Figure 3:
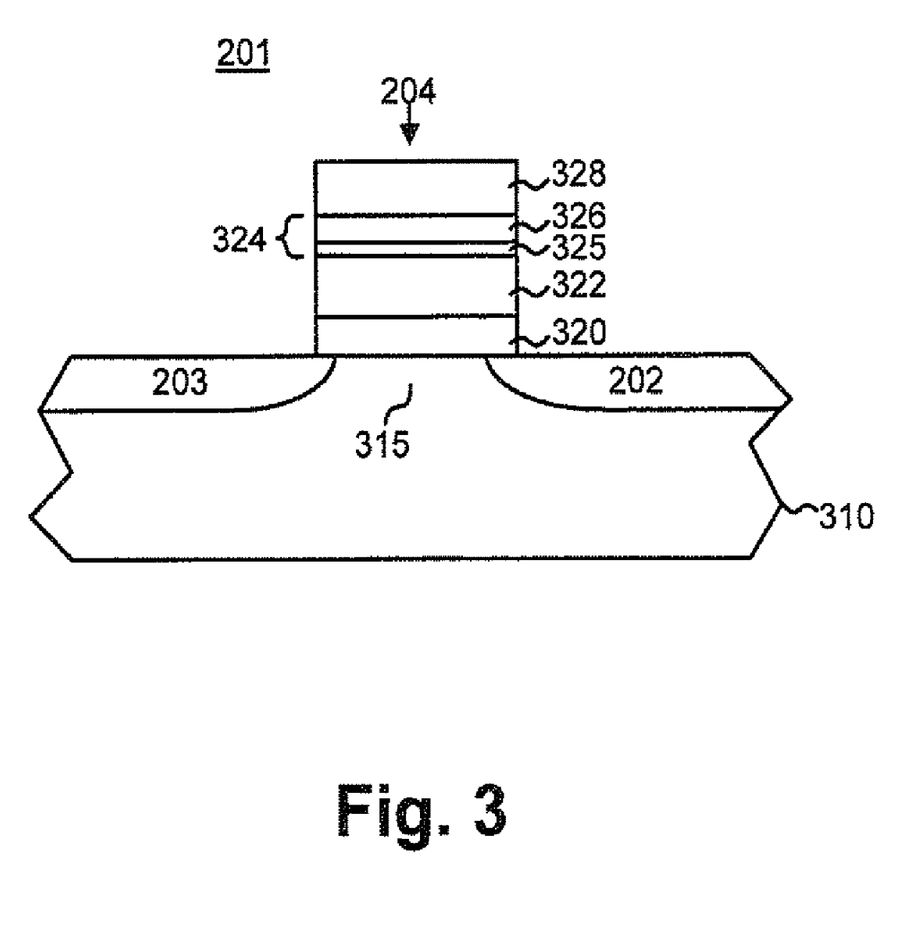
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed. Memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S1. These voltages generate a vertical and lateral electric field in the activated memory cell(s) (e.g., the circled memory cell in FIG. 2) along the length of the channel from the source to the drain. These electric fields causes electrons to be drawn off the source and begin accelerating toward the drain. As they move along the length of the channel, they gain energy. If they gain enough energy, they can jump over the potential barrier of the dielectric layer 320 into one side of charge storage layer 322 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
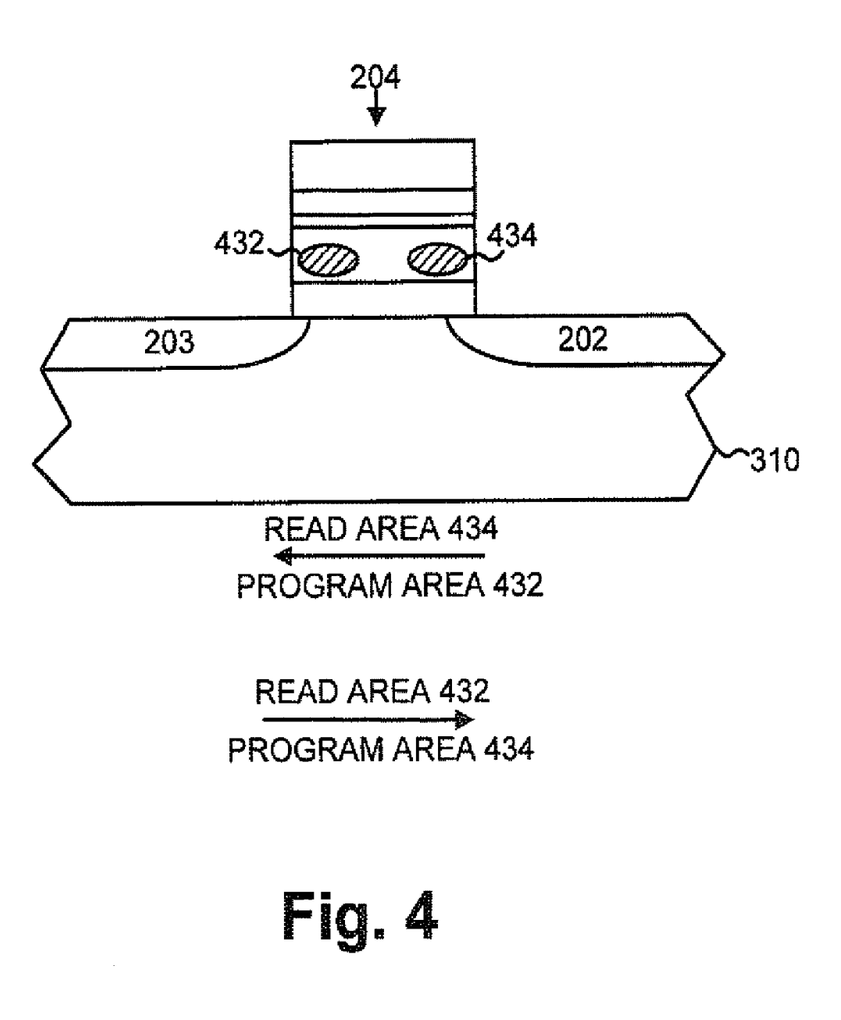

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Memory Device Read Modes

Read operations in conventional NOR flash memory devices are typically accomplished by randomly or sequentially accessing desired memory cells in array 102. NAND flash memory devices, on the other hand, are typically read by referencing a page of data in which the desired data is stored. Accordingly, read operations in NAND flash memory devices require that the entire page of data be read into the output memory. As described above, although memory cells in NOR flash memory devices may be individually accessed, it may be desirable to form page-like groups of memory cells to facilitate NAND-like interaction and performance. As set forth above, the array 102 in memory device 100 may be so configured.

Figure 5:
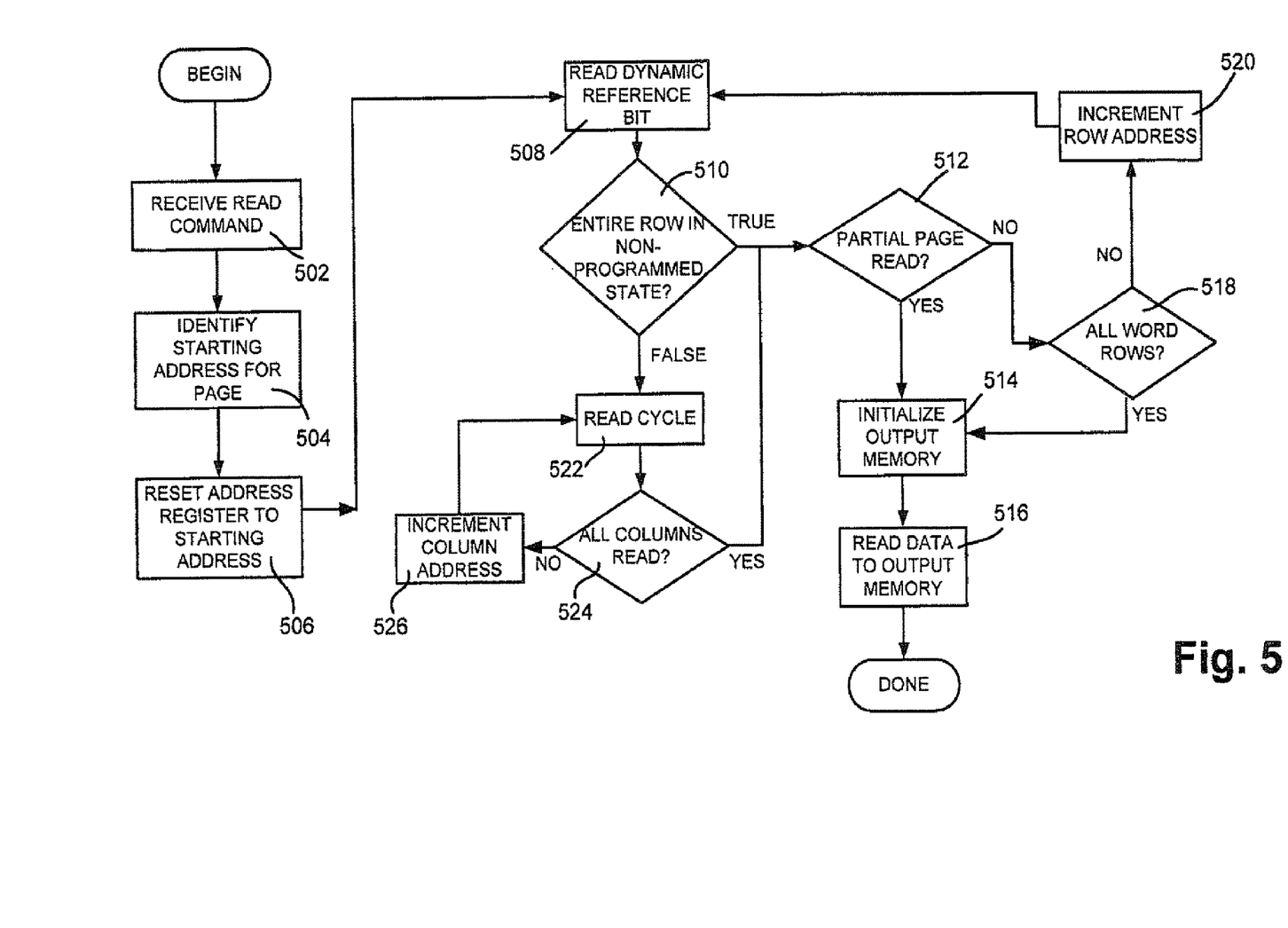
FIG. 5 is a flow diagram illustrating one exemplary method for reading the memory cells of FIGS. 2 and 3.

FIG. 5 is a flow diagram illustrating exemplary operations for performing a read operation from memory device 100. Initially, the read operation may begin when a read command is received that indicates the address of a memory cell to be read (act 502). In one implementation consistent with principles of the invention, this command may further include an indication regarding whether an entire page or a partial page of data should be read from memory device 100. As described briefly above, each page in array 102 may be made up of multiple (e.g., four) rows of data. Additional details regarding the various read modes will be set forth in additional detail below.

Typically, external circuitry may initiate the page read operation by, for example: activating chip enable line 138, activating output enable line 140, setting byte line 136 to select whether eight or sixteen of I/O lines 116 will be used, and placing an appropriate address on address lines 104.

Once an address has been received, the starting address for the page containing the received address is identified (act 504). This enables memory device 100 to read the entire page in which the received address is located, beginning with the identified starting address, rather than just data from the memory cell specified by the received address. Address register 106 may then be set to the starting address identified in act 504 (act 506). The starting address refers to a memory cell location on the first row of the identified page.

At this point, a dynamic reference bit associated with the selected row is retrieved (act 508). As briefly described above, dynamic reference bits associated with each row in core array 102 may be stored in spare area 111. The logical value (e.g., a "0" or "1") of these bits indicate whether the entire row is in a non-programmed state (i.e., "blank"), with a "1" indicating that the each memory cell in the selected row is erased, and a "0" indicating that at least one memory cell in the selected row is programmed.

Once retrieved, it is then determined whether the row's dynamic reference bit indicates that the row is non-programmed (act 510). If it is determined that the selected row's dynamic reference bit indicates that the row is non-programmed, the process continues to act 512, where is it determined whether the received read command indicates a partial page read or a full page read. In accordance with principles of the invention, a partial page may be defined as any portion of a page less than its entirety. In a more specific implementation, a partial page may refer to a single row of memory cells 201 in array 102, with a full page referring to four consecutive rows. If a partial page read command has been received, the corresponding output memory 112 is initialized (act 514) and the row's data (or lack thereof) is read to output memory 112 (act 516). If no data is included in the row, no data from array is read into the cache. Rather, each corresponding bit in the output memory is set to an erase state.

However, if it is determined in act 512 that a full page read command was received, the process continues to act 518 where it is determined whether all rows (i.e., word lines) for the selected page have been read. If all rows of data have been read, then it is determined that the entire page has been read and the process proceeds to act 514 set forth above. However, if all rows in the page have not been read, the row address is incremented to starting address for the next row in the page (act 520). Following row address incrementation, the read process returns to act 508, for processing of the next row in the page.

Returning to act 510, if it is determined that the dynamic reference bit indicates that at least one memory cell in the selected row has been programmed, a read operation for the current memory cell in the row is then performed (act 522). In the case of a new row, the current memory cell is set to the starting address for the row. Next, it is determined whether each column (e.g., each bit line 215) in the row has been read (act 524). If not, the column address is incremented (act 526) and the process returns to act 522 for reading in data from the next column in the row.

If it is determined in act 524 that all columns in the row have been read, this indicates that the entire row has been read and the process continues to act 512, where the page mode of the command is identified. The process then continues through acts 514-520 set forth above.

CONCLUSION

As described above, a read operation for a memory device may be performed based on a page or partial page identification. Additionally, dynamic reference bits associated with the page or partial page may be used to indicate the programmed state of the page or partial page, thereby improving read times.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 5, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A device comprising:
   an array of memory cells; and
   one or more components to:
      receive a read command including an address for a memory cell, of the array of memory cells, and an indication regarding whether the read command is a full page read command or a partial page read command,
      identify a page associated with the received address, the page including multiple rows of memory cells, of the array of memory cells,
      determine whether the received read command indicates that the received read command is a partial page read command when all memory cells in a selected row in the page are in a non-programmed state, and output data indicative of the non-programmed state of the selected row when the read command is a partial page read command.

2. The device of claim 1, where, when identifying the page including the received address, the one or more components are to:
identify a starting address for the page, and
set an address register, associated with the device, to the starting address.

3. The device of claim 1, where the one or more components are further to:
read a dynamic reference bit associated with the selected row, and
determine whether all memory cells in the selected row are in a non-programmed state based on the dynamic reference bit.

4. The device of claim 1, where the one or more components are further to:
determine whether all rows associated with the page are read when the read command is not a partial page read command; and
output data, indicative of data stored in at least one of the rows associated with the page, to an output memory when all rows associated with the page are read.

5. The device of claim 4, where the one or more components are further to:
increment a row address to a starting address for a next row when all rows associated with the page are not read, and
read data in the next row upon incrementing the row address.

6. The device of claim 1, where the one or more components are further to:
read a reference bit associated with the selected row, and
determine that one or more memory cells, associated with the selected row, have been programmed based on the reference bit.

7. The device of claim 1, where the one or more components are further to:
read a memory cell in the selected row, and
determine, after reading the memory cell, whether each column associated with the selected row has been read.

8. The device of claim 7, where the one or more components are further to:
increment a column address to a next column in the selected row when each column, associated with the selected row, has not been read, and
read the next column.

9. The device of claim 8, where the one or more components are further to:
determine that each column associated with the selected row has been read, and identify a page mode associated with the read command when each column associated with the selected row has been read.

10. A memory device comprising:
an array of non-volatile memory cells, the array comprising:
a plurality of columns, and
a plurality of rows;
control logic to receive a read command identifying a memory cell to be read, where the read command includes a row address designating a selected row, of the plurality of rows, and a column address designating a selected column, of the plurality of columns;
control logic to determine whether each memory cell, in the selected row, is in a non-programmed state;
control logic to determine whether the received read command indicates that the received read command is a partial page read command when each memory cell, in the selected row, is in the non-programmed state; and
control logic to output data to an output memory indicative of the non-programmed state of the memory cells in the selected row.

11. The memory device of claim 10, further comprising:
control logic to identify a starting address, including a first column address, for the selected row based on the received read command; and
control logic to set an address register, associated with the memory device, to the first column address.

12. The memory device of claim 10, comprising:
control logic to perform read operations on all memory cells in the selected row when at least one memory cell in the selected row is not in a non-programmed state; and
control logic to output data to an output memory indicative of data stored in the selected row when the received read command includes a partial page read command.

13. The memory device of claim 12, where the selected row is associated with a page,
the memory device further comprising:
control logic to determine whether all rows in the page have been read when the received read command includes a full page read command;
control logic to increment the row address to a next row in the page when all rows in the page have not been read; and
control logic to read the next row in the page.

14. The memory device of claim 13, where, when incrementing the row address to the next row in the page, the control logic is to increment the row address to a starting address for the next row.

15. The memory device of claim 12, further comprising:
control logic to determine whether all columns in the selected row have been read when the at least one memory cell in the selected row is not in a non-programmed state;
control logic to increment the column address to a next column in the selected row when all columns in the selected row have not been read; and
control logic to read the next column in the selected row upon incrementing the column address.

16. The memory device of claim 10, where the control logic to determine whether each memory cell in the selected row is in the non-programmed state comprises:
control logic to read a dynamic reference bit associated with the selected row,
where the control logic determines, based on the dynamic reference bit, whether each memory cell, in the selected row, is in the non-programmed state.

17. The memory device of claim 10, further comprising:
a plurality of sense amplifiers operatively connected to a plurality of bit lines, associated with the plurality of columns, for sensing a threshold voltage for memory cells connected to the bit lines.

18. The memory device of claim 10, further comprising:
control logic to configure a dynamic reference bit associated with a selected row of memory cells in the page to indicate whether all memory cells in the selected row are in a non-programmed state.

19. The memory device of claim 10, where at least one of the memory cells includes a semiconductor-oxide-nitride-semiconductor (SONOS) type NOR memory cell.

* * * * *